(12) United States Patent
Ouyang et al.

(10) Patent No.: US 7,682,913 B1
(45) Date of Patent: Mar. 23, 2010

(54) PROCESS FOR MAKING A MCSFET

(75) Inventors: Xu Ouyang, Hopewell Junction, NY (US); Louis Lu-Chen Hsu, Fishkill, NY (US); Xinhui Wang, Poughkeepsie, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/359,731

(22) Filed: Jan. 26, 2009

(51) Int. Cl.
    *H01L 21/336* (2006.01)
(52) U.S. Cl. .............................. 438/289; 257/E29.264; 257/E21.135
(58) Field of Classification Search .......... 438/289–291
    See application file for complete search history.

(56) References Cited

U.S. PATENT DOCUMENTS

| | | | |
|---|---|---|---|
| 4,953,127 A | 8/1990 | Nagahashi et al. | |
| 6,920,061 B2 | 7/2005 | Bhavnagarwala et al. | |
| 7,064,019 B2 * | 6/2006 | Fried et al. | 438/149 |
| 7,123,529 B1 | 10/2006 | Hanson et al. | |
| 7,170,809 B2 | 1/2007 | Joshi | |
| 7,208,804 B2 | 4/2007 | Ahn et al. | |
| 7,217,978 B2 | 5/2007 | Joshi et al. | |
| 7,242,239 B2 | 7/2007 | Hanson et al. | |
| 7,259,434 B2 | 8/2007 | Ahn et al. | |
| 7,262,104 B1 * | 8/2007 | Wang et al. | 438/289 |
| 7,295,458 B2 | 11/2007 | Chan et al. | |
| 7,297,581 B1 | 11/2007 | Hill et al. | |
| 7,429,515 B2 | 9/2008 | Ahn et al. | |
| 2004/0217433 A1 * | 11/2004 | Yeo et al. | 257/412 |
| 2006/0273393 A1 | 12/2006 | Chidambarrao et al. | |
| 2007/0238273 A1 * | 10/2007 | Doyle et al. | 438/525 |
| 2008/0111185 A1 * | 5/2008 | Cheng | 257/347 |

OTHER PUBLICATIONS

U.S. Appl. No. 11/969,981 Title: SRAM Device, And SRAM Device Design Structure, With Adaptable Access Transistors Applicant: Xu Ouyang, et al. Filing Date: Jan. 7, 2008.
L Chang, et al.—Stable SRAM Cell Design for the 32nm Node and Beyond—2005 Smposium on VLSI Technology Digest of Technical Papers—pp. 128-129.
Xu Ouyang, et al.-"SRAM Device And SRAM Device Design Structure, With Adaptable Access Transistors"—Filed Jan. 7, 2008—U.S. Appl. No. 11/969,981.

* cited by examiner

*Primary Examiner*—Charles D Garber
*Assistant Examiner*—Bryan Junge
(74) *Attorney, Agent, or Firm*—Joseph P. Abate

(57) ABSTRACT

A process for making a MCSFET includes providing a first implant through a first side of an elongated stack, and then providing a second implant through a second side of the stack. The first implant has a dose different than the dose of the second implant, so that final dopant concentrations in the first and second sides differ and the transistor has two threshold voltages Vt1, Vt2.

17 Claims, 15 Drawing Sheets

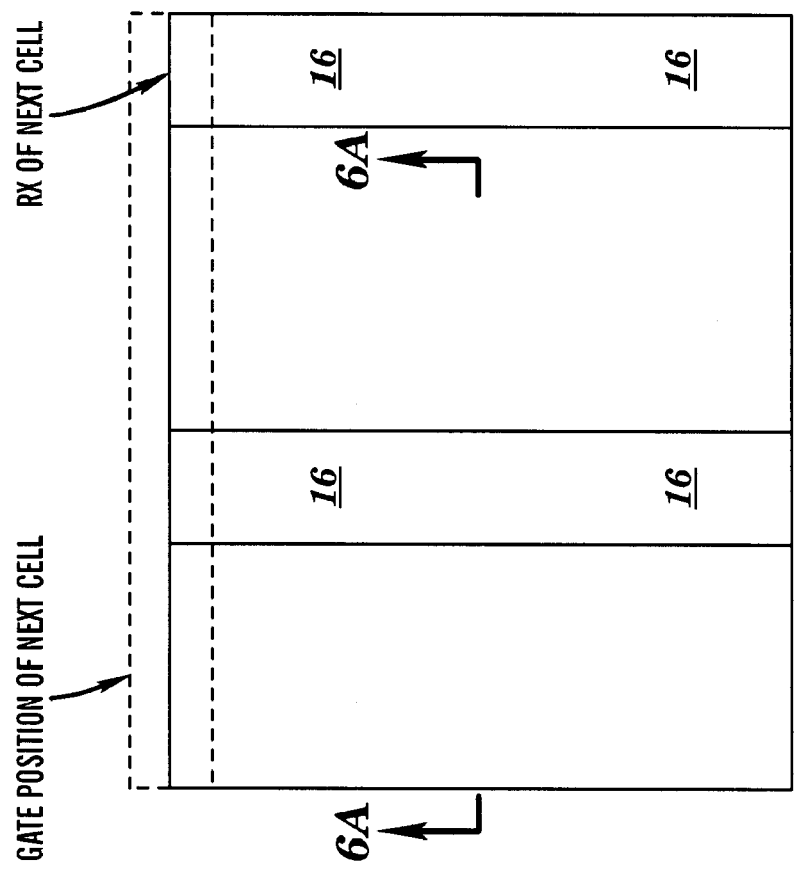
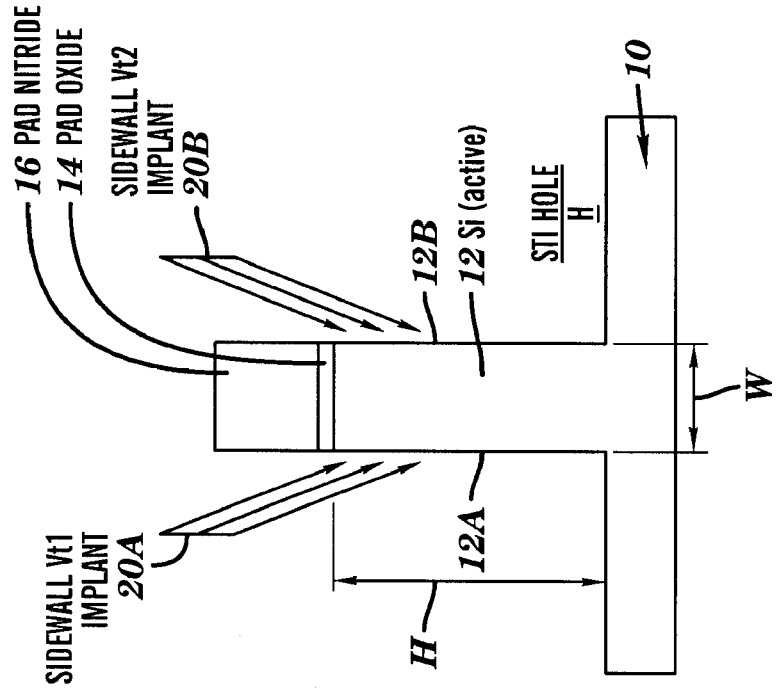
FIG. 6A
FIG. 6B

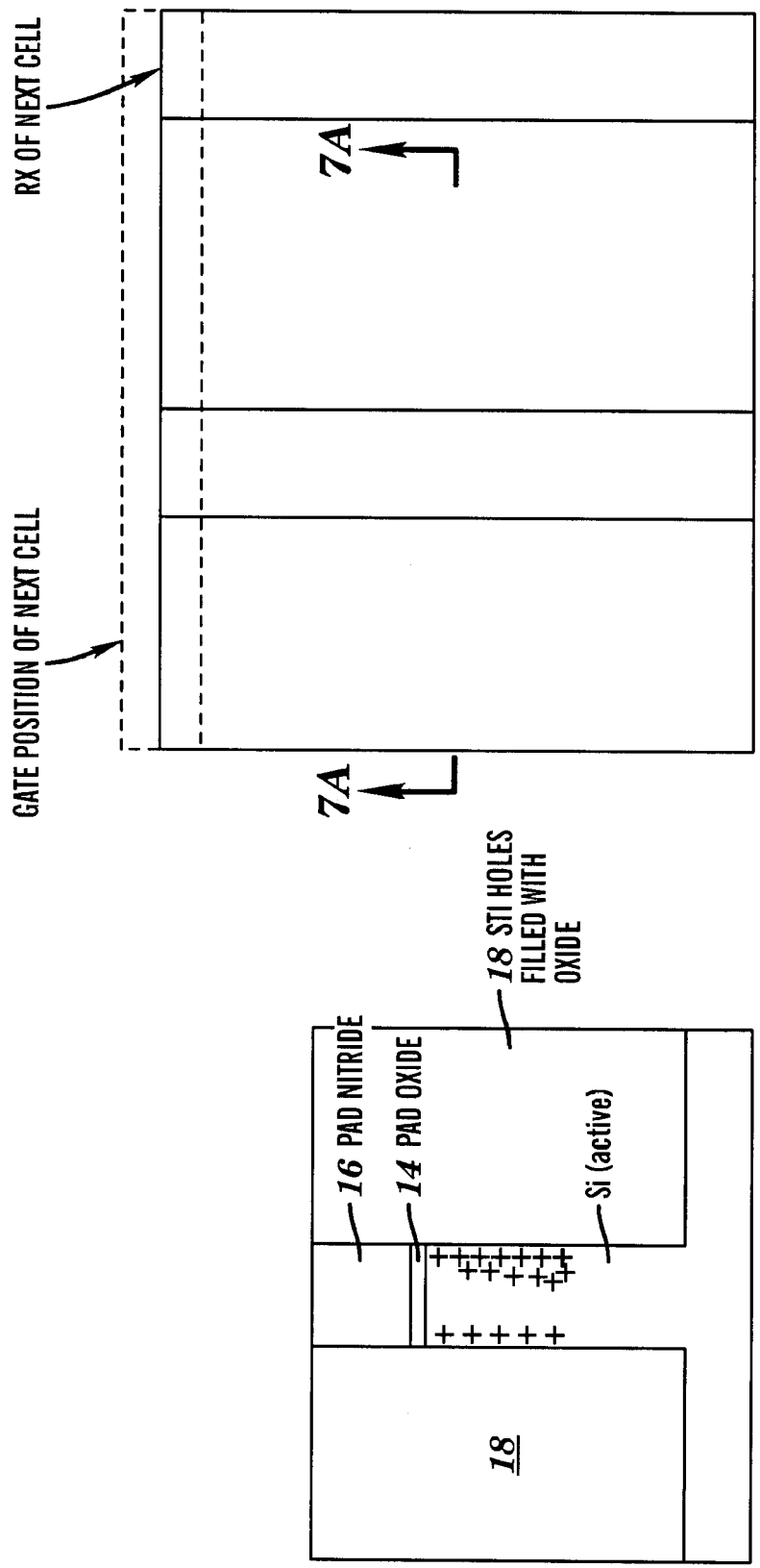

PROCESS FOR MAKING A MCSFET

CROSS REFERENCE TO RELATED APPLICATION

This application is related to commonly-owned co-pending patent application Ser. No. 11/969,981 filed on Jan. 7, 2008, entitled "SRAM DEVICE AND SRAM DEVICE DESIGN STRUCTURE, WITH ADAPTABLE ACCESS TRANSISTORS", by Xu Ouyang, et al. (hereinafter "Related Patent Application").

BACKGROUND OF THE INVENTION

The present invention generally relates to semiconductor memory devices and, more particularly, to processes for making a MCSFETs (Multiple Conduction State Field Effect Transistors) useful, for example, as adaptable access transistors for Static Random Access Memory (SRAM) devices.

Referring to FIGS. 1A and B, in the known 6 transistor (6T) SRAM cell that is widely used in the industry today, read and write operations have different requirements for access transistors (pass gates N3,N4). During the read operation, a pull-down transistor (e.g., N1) is fighting with the access transistor (e.g., N3) to pull a bitline BL voltage level down. Therefore, a strength of the access transistor N3 should be less than that of the pull-down transistor N1. During the write operation, the access transistor (e.g., N3) is fighting with a pull-up transistor P1 to pull the internal node down. Therefore, a strength of the access transistor N3 should be more than that of the pull-up transistor P1. To satisfy requirements of both the read and write operations, the access transistor N3 strength must be suitably between those of the pull-up and the pull-down transistors P1,N1. The same rationale applies to the access transistor N4 and the pull-up and pull-down transistors P2,N2. However, as integrated circuit (IC) scaling continues to progress (e.g., shrink), it becomes increasingly challenging for IC designers and manufacturers to control the variations in SRAM circuits. Thus, it is increasingly difficult to control access transistor strength to be suitably between those of the pull-up and the pull-down transistors.

Various 6T and other SRAM devices, their methods of operation and processes for their manufacture are described, for example, in U.S. Pat. No. 6,920,061, LOADLESS NMOS FOUR TRANSISTOR DYNAMIC DUAL VT SRAM CELL, filed Aug. 27, 2003, to Bhavnagarwala et al.; U.S. Pat. No. 7,217,978, SRAM MEMORIES AND MICROPROCESSORS HAVING LOGIC PORTIONS IMPLEMENTED IN HIGH-PERFORMANCE SILICON SUBSTRATES AND SRAM ARRAY PORTIONS HAVING FIELD EFFECT TRANSISTORS WITH LINKED BODIES AND METHOD FOR MAKING SAME, filed Jan. 19, 2005, to Joshi et al.; U.S. Pat. No. 7,295,458, EIGHT TRANSISTOR SRAM CELL WITH IMPROVED STABILITY REQUIRING ONLY ONE WORD LINE, filed Jan. 18, 2006, to Chan et al.; and U.S. Pat. No. 7,170,809, STABLE MEMORY WITH HIGH MOBILITY CELL DEVICES, filed May 13, 2005, to Joshi, which are all hereby incorporated in their entireties by reference.

Various other techniques have been proposed in the prior art to address the difficult challenge. See for instance, in "2005 *Symposium on VLSI Technology Digest of Technical Papers*", page 128-129, the paper titled "Stable SRAM Cell Design for the 32 nm Node and Beyond" which describes an 8-transistor SRAM cell to address the problem mentioned previously. However, the 8-transistor SRAM design requires additional transistors, word-lines, and bit-lines, and therefore seems significantly to increase the area of the SRAM and to add process complexity.

Another example is U.S. Pat. No. 4,953,127 by Nagahashi et al. which describes a semiconductor memory having different read and write word line voltage levels. However, the choice of word line voltage levels is limited by device reliability and various other circuit and technology concerns. Therefore, its advantage seems to be limited.

Further, multiple conduction state field effect transistors (MCSFETs) are known. See, for example, U.S. Patent Application Publication No. 2006/0273393, by Chidambarrao et al., STRUCTURE AND METHOD OF MAKING FIELD EFFECT TRANSISTOR HAVING MULTIPLE CONDUCTION STATES, filed Jun. 7, 2005, which is hereby incorporated in its entirety by reference.

See also U.S. Pat. No. 7,123,529 by Hanson et al. and U.S. Pat. No. 7,242,239 by Hanson et al. The '393 Publication, and the '529 and '239 patents are all hereby incorporated in their entireties by reference.

The multiple-conduction state FET ("MCSFET") is similar to known FETs in that it has an essentially non-conductive state when a gate to source voltage applied to the MCSFET does not exceed a first threshold voltage. The MCSFET also has a fully conductive state when the gate to source voltage is above a second threshold voltage or "final threshold voltage" that enables the MCSFET to be fully conductive. The fully conductive state is defined as a level in which an inversion layer forms in the channel region as a result of the voltage applied between the gate and the source of the MCSFET.

However, unlike ordinary FETs, the first threshold voltage and the final threshold voltage have different values. When the gate to source voltage is between the first threshold voltage and the final threshold voltage the MCSFET has another conductive state in which the MCSFET is turned on, but conducts a relatively low amount of current. At that time, the MCSFET conducts a current having a magnitude which is, for example, ten or more times smaller than the current conducted when the MCSFET exceeds the final threshold voltage level. Here, when the gate to source voltage is at such level, the MCSFET is turned on, in that an inversion layer forms in a part of the channel region as a result of the voltage applied between the gate and the source of the MCSFET. The difference is that when the gate to source voltage is above the final threshold voltage and the MCSFET is in the second conductive state, the inversion layer of the MCSFET extends within a larger part of the channel region so as to turn on a larger part of the transistor. Thus, a predetermined part of the MCSFET smaller than the entire MCSFET becomes fully conductive when the gate to source voltage exceeds the first threshold voltage, and a remaining predetermined part of the MCSFET becomes fully conductive when the gate to source voltage exceeds the second or "final" threshold voltage level.

In particular known embodiments, the MCSFET is fabricated in such way that the transistor has one threshold voltage for a first part of the width of the transistor channel, and has a higher threshold voltage for the remaining part of the transistor channel width. For example, the transistor can have a gate oxide that varies in thickness between the two parts of the transistor channel width, and conditions in which threshold voltage implants are conducted in the two parts of the transistor channel can be varied in order to achieve the desired difference in threshold voltages.

SUMMARY OF THE INVENTION

The present inventors believe that improvements in processes for fabricating a MCSFET can be achieved if, for example, a first implant for a first threshold voltage (Vt1) is provided through the first side of a gate stack facing in a first direction and a second implant for a second threshold voltage (Vt2) is provided through a second side of the gate stack facing in a second direction, the first direction differing from the second direction by approximately 180°. The second implant creates a dopant concentration in the second sidewall which is at least approximately eight to approximately ten times greater than a dopant concentration created by the first implant in the first sidewall. A further preferred embodiment includes providing a $Si_{1-x}Cx$ layers onto the first and second sides of the gate stack. A still further preferred embodiment includes providing a metallic layer onto the first and second sides of the gate stack. The metallic layers (such as LaO layers) assist Vt modulation.

Preferred embodiments of processes for fabricating a MCSFET are disclosed and claimed herein, with references particularly to FIGS. 6-11.

Further preferred embodiments are shown, for example, with reference to FIGS. 12-14, and to FIGS. 15-20.

OBJECTS OF THE INVENTION

Accordingly, it is principal object of the present invention to provide a process for making or fabricating an MCSFET.

Further and still other objects of the present invention will become more readily apparent when the detailed description is taken in conjunction with the following drawing figures.

BRIEF DESCRIPTION OF THE DRAWINGS

FIGS. 6-11 of the accompanying drawings illustrate the presently preferred embodiments of the process of the present invention which, together with the general description given above and the detailed description of the preferred embodiments given below serve to explain the present invention.

FIG. 6A is a side sectional schematic view of a first step according to a preferred embodiment of the present invention; taken through the dotted-dashed line and viewed in the direction of the arrow shown in the top-down schematic view of FIG. 6B.

FIG. 7A is a side sectional schematic view of a second step according to the preferred embodiment of the present invention; taken through the dotted-dashed line and viewed in the direction of the arrow shown in the top-down schematic view of FIG. 7B.

DETAILED DESCRIPTION OF PREFERRED EMBODIMENTS AND BEST MODE

Hereinafter will be described the details of one or more preferred embodiments of the invention as set forth in the Related Patent Application, and then details of one or more preferred embodiments for making or fabricating a MCSFET according to the present invention.

Figure 2:
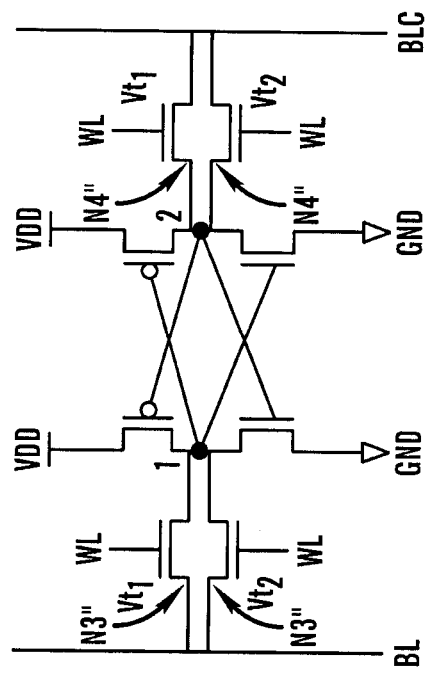
FIG. 2 is a schematic circuit diagram of an SRAM device according to a preferred embodiment of an invention with adaptable access transistors (i.e., MCSFETs) as set forth in the Related Patent Application.

SRAM Device with MCSFETs as Access Transistors:

Referring now to FIG. 2, a 6T SRAM device 10 includes a pair of MCSFETs N3' and N4' connected as access transistors. Of course, as is understood by those skilled in the art, the SRAM device 10 per se may exclude voltage sources for generating the biasing voltages VDD and signal and line voltages BL, BLC, WL. Each access transistor N3',N4' has dual Vt's (Vt1,Vt2) in this SRAM cell (device): half of the transistor device can be turned on at Vt1, while the other half can be turned on at Vt2. The SRAM 10 is fabricated by any known MCSFET and MOSFET fabrication processes, which need not be further discussed. For such fabrication processes, see, for example, the text *VLSI Technology* by S. M. Sze, second edition (McGraw Hill Pub. Company, 1988, TK7874.V566 1988, ISBN 0-07-062735-5). For several various known MCSFETs and applications, see the patent publication and patents previously incorporated by reference.

Alternatively, the SRAM 10, and more particularly the access transistor N3' or N4' is fabricated according to a preferred process embodiment of the present invention. Such process embodiment is shown and described hereinafter with reference to FIGS. 6-11. Alternative preferred process embodiments according to the present invention are shown and described with reference to FIGS. 12-14 and to FIGS. 15-20.

Figures 1A, 1B:
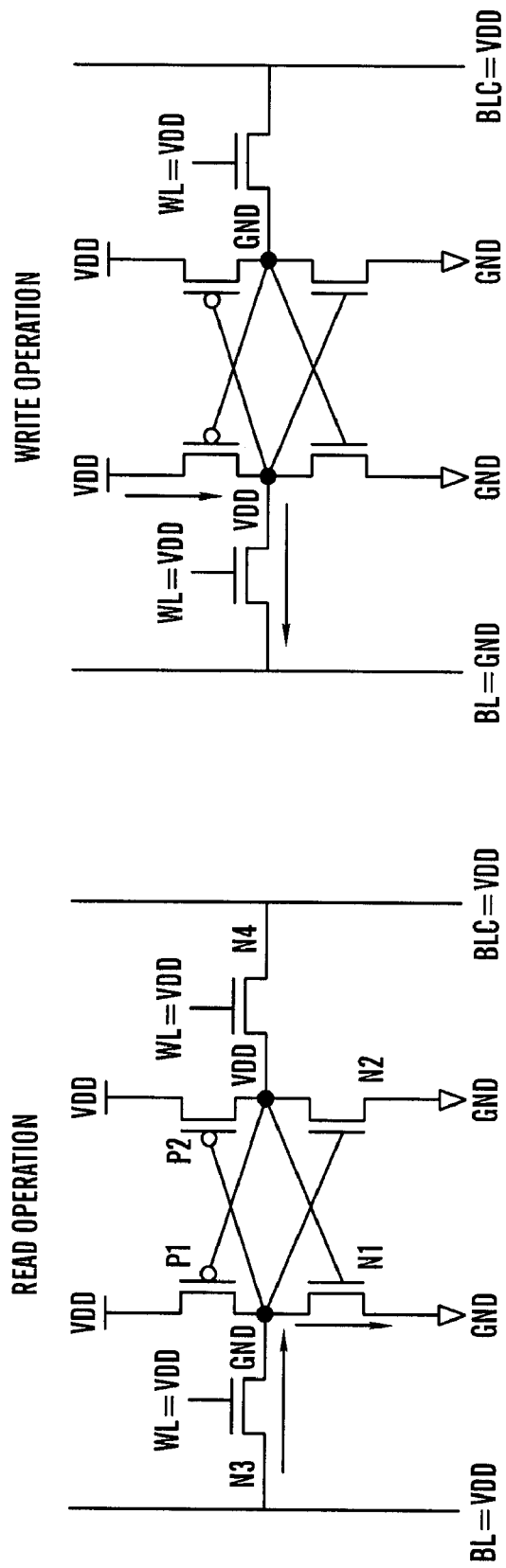
FIGS. 1A and B are schematic circuit diagrams of a conventional 6-transistor (6T) SRAM device.

During a read operation as shown in FIG. 2, a wordline (WL) voltage is set to a level between $V_{t1}$ and $V_{t2}$, and then only partial of the transistor (e.g., N3') with $V_{t1}$ is turned on—which makes the transistor weak. During a write operation, a wordline voltage (WL) is set to a level which is higher than $V_{t2}$. Therefore, the entire transistor (e.g., N3') is turned on which makes the transistor N3' strong with a large drivability. Because the strength of access transistors N3',N4' can be adaptively changed by the applied wordline voltage depending on read or write operations, the soft failures related to both read and write operations are believed significantly reduced. Also, because each of the access transistors is still a "single" transistor, although each has dual threshold voltages $V_{t1}, V_{t2}$, the transistors N3',N4' do not occupy significant additional area compared with regular (e.g., non-MCSFETs) access transistors. This is believed to be a significant advantage compared with the known 6-transistor SRAM as shown in FIGS. 1A and 1B.

Figure 3:
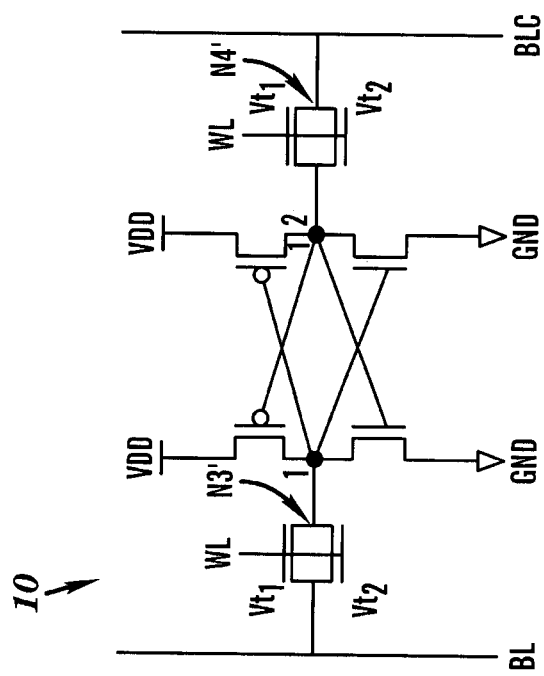
FIG. 3 is another embodiment of the invention as set forth in the Related Patent Application, where each adaptable access transistor is replaced by a pair of regular access transistors with different threshold voltages.

FIG. 3 shows an alternative embodiment without MCSFETs. Here, each dual-Vt access transistor is replaced by two separate regular access transistors N3",N4" connected in parallel, each having a different Vt (voltage threshold) as shown. This SRAM design has the same advantage of reducing soft failures during read and write operations as the SRAM design in FIG. 2, and it can be fabricated without any additional material process steps because the access transistors here are purely regular (MOSFET) transistors. However, in the embodiment of FIG. 3, the SRAM cell size is slightly larger than that of a conventional 6-transistor SRAM because it has 8 transistors. However, its size is still smaller than that of a conventional 8-transistor SRAM proposed, for example, by Chang et al. (discussed in the background section) because no additional word-lines or bit-lines are needed.

Figure 4:
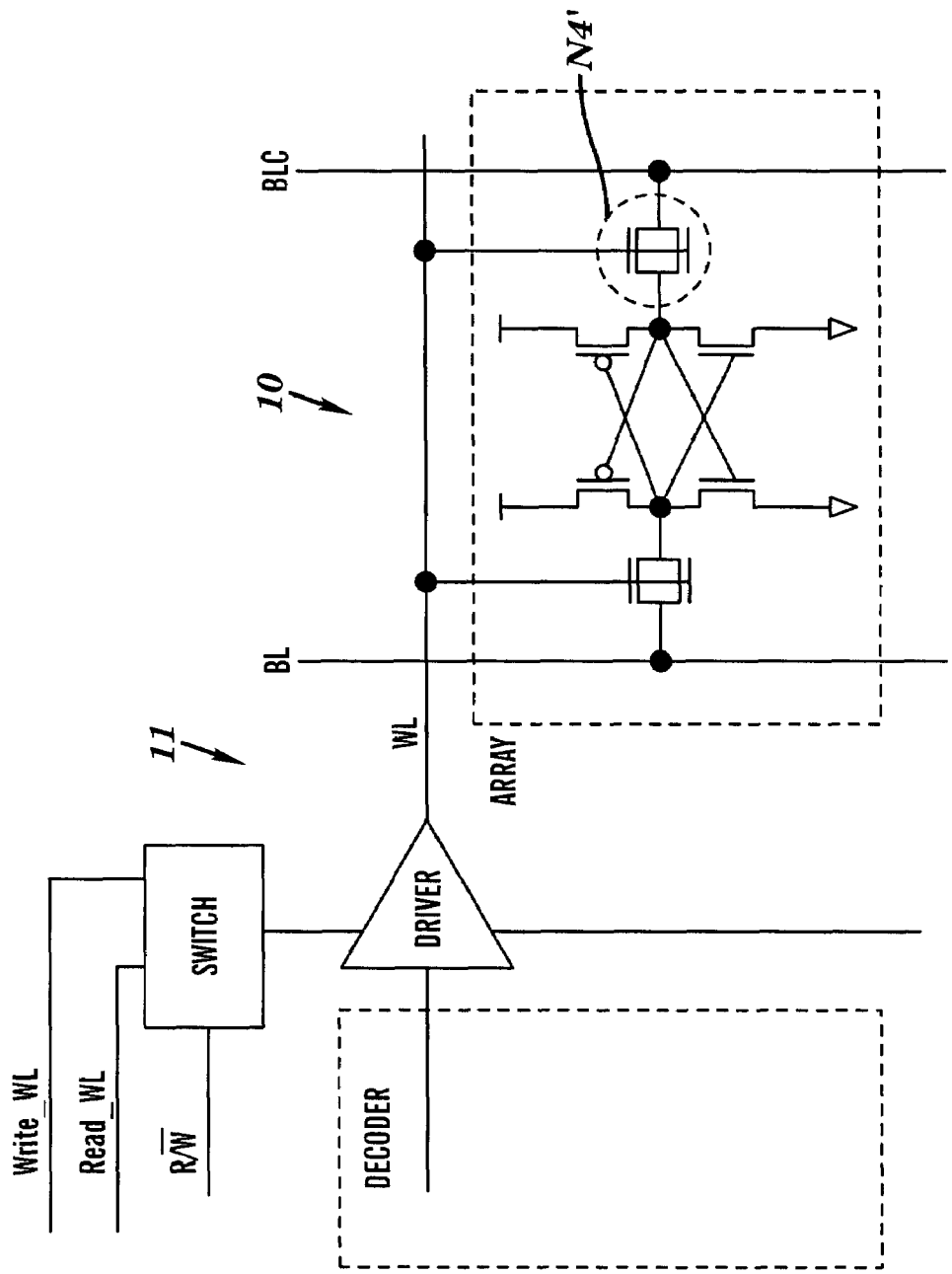
FIG. 4 is a schematic circuit diagram of wordline control circuit connected to the SRAM having MCSFETs N4' where a wordline voltage (WL) can be adaptively changed during the read and write operations as set forth in the Related Patent Application.

A circuit design of a word-line voltage control circuit to provide two voltages during read and write cycles (operations) is shown in FIG. 4. FIG. 4 shows a schematic circuit diagram illustrating one preferred implementation of the word line voltage control circuit 11 connected to the SRAM device (cell) 10 having MCFETs N4'. A switch block is used to select either a Write-WL voltage during a write operation or a Read-WL voltage during a read operation. The corresponding voltage level is fed to the word-line (or WL) via a word-line driver. A decoder is connected as shown. The various elements of the circuit 11 can be readily realized by those skilled in the art with suitable conventional components tailored to suit the SRAM cell 10. Other designs and implementations have also been described in various technical literatures.

In one preferred embodiment of the invention as set forth in the Related Patent Application, which can be fabricated for a 45 nm technology node, $V_{t1}$ is approximately ($\pm 10\%$) 0.35V, $V_{t2}$ is approximately 0.8V, and VDD is, for example, approximately 1 volt.

Figure 5:
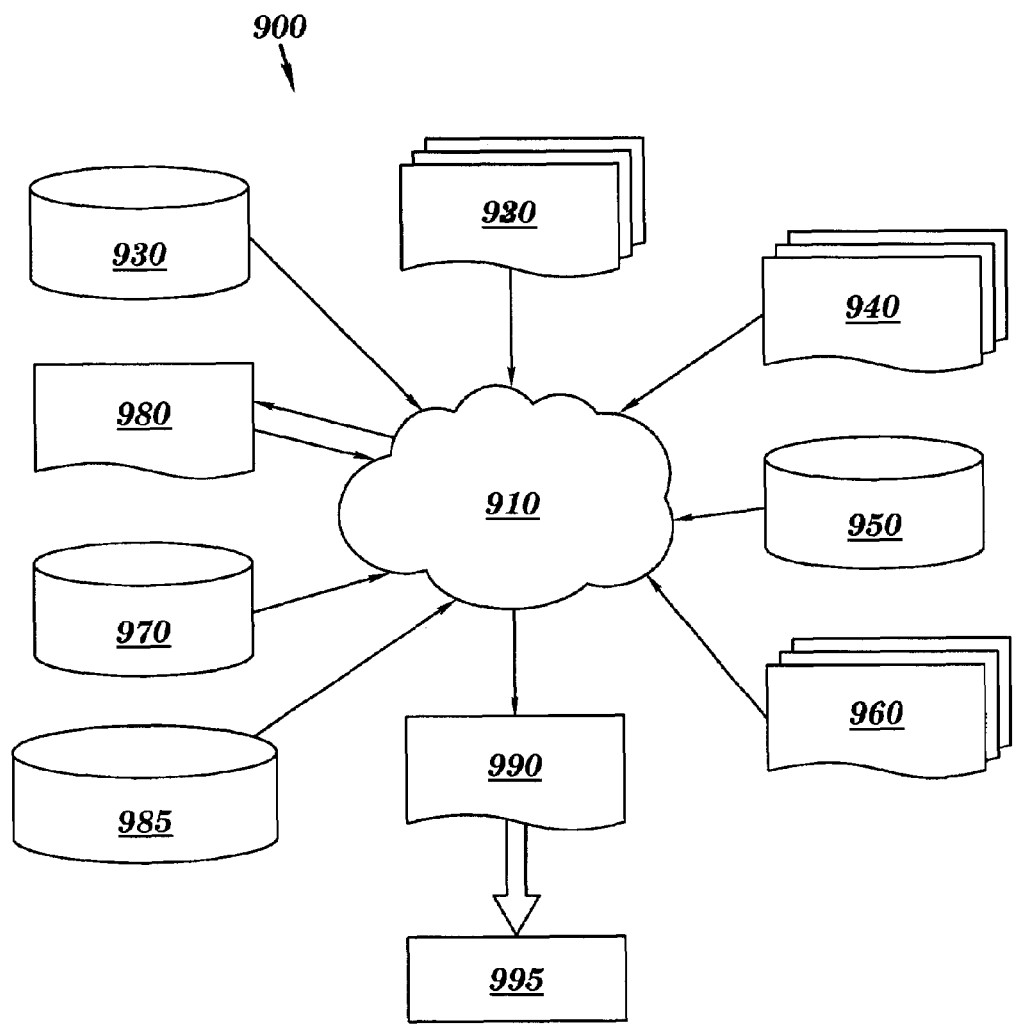
FIG. 5 is a flow diagram of a design process useable in semiconductor device design, manufacture and/or test according to another preferred embodiment of the present invention.
Figure 8B:
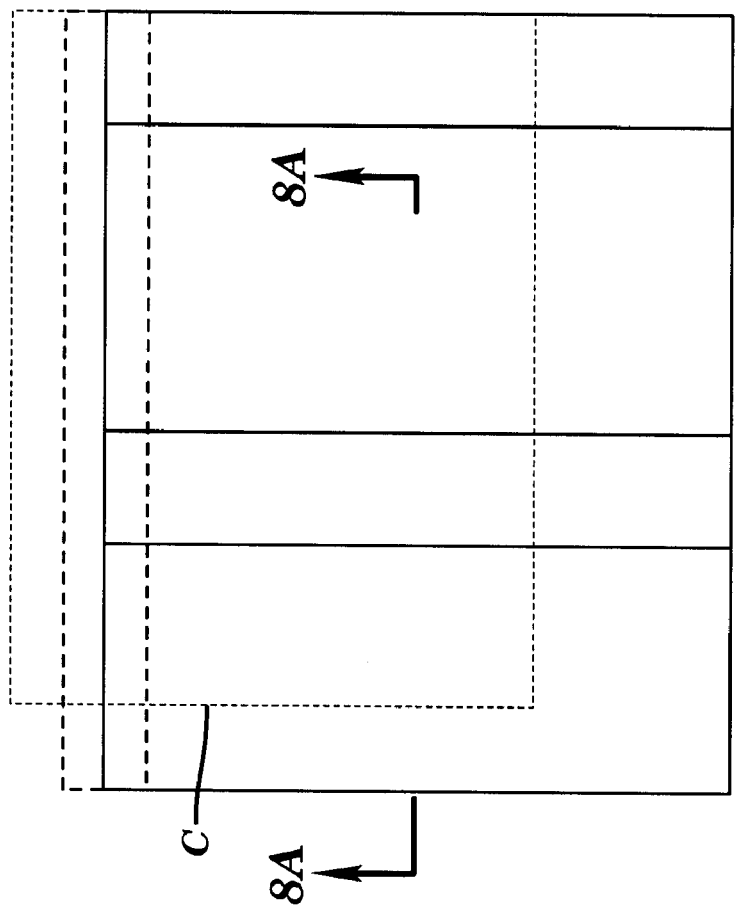
Figure 8A:
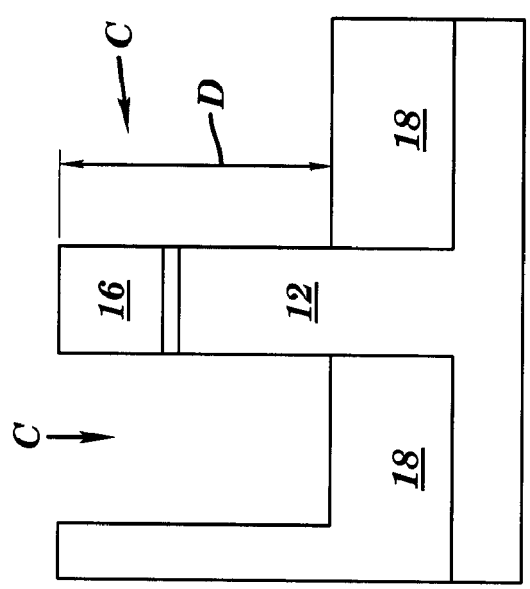
FIG. 8A is a side sectional schematic view of a third step according to the preferred embodiment of the present invention; taken through the dotted-dashed line and viewed in the direction of the arrow shown in the top-down schematic view of FIG. 8B.

FIG. 5 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component. Design structure 920 is preferably an input to a design process 910 and may come from an IP provider, a core developer, or other design company or may be generated by the operator of the design flow, or from other sources. Design structure or structures 920 comprises an embodiment as shown, for example, in FIG. 11A hereinafter described, in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 2. Design process 910 preferably synthesizes (or translates) an embodiment of the invention as shown in FIG. 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the present invention.

Figure 11B:
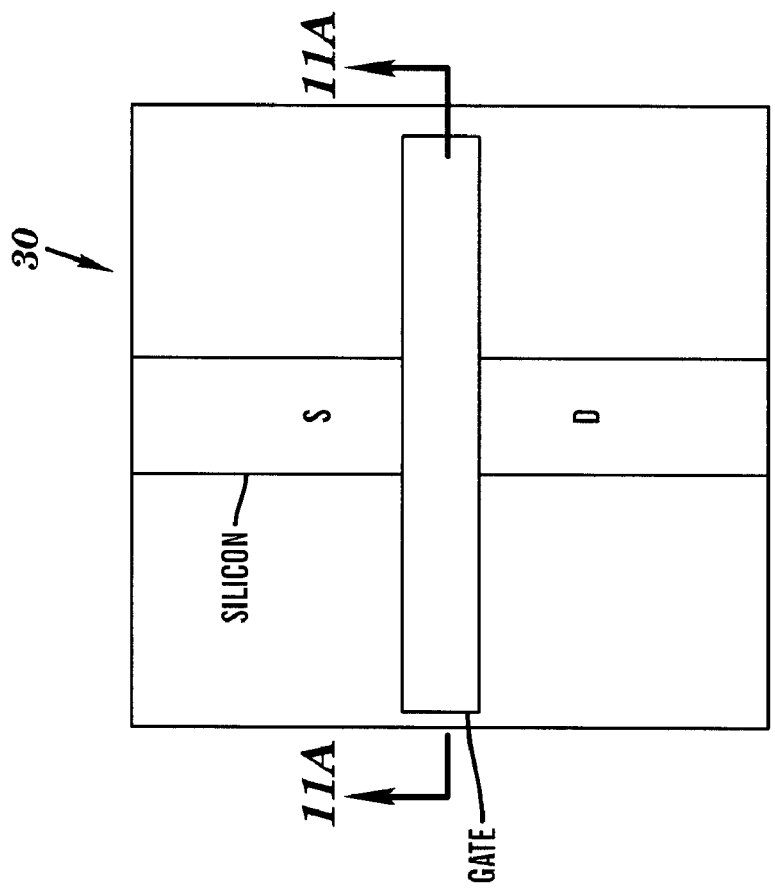
Figure 11A:
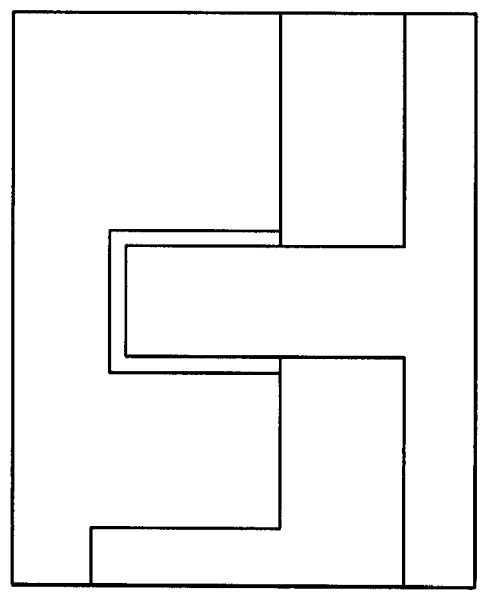
FIG. 11A is a side sectional schematic view of a sixth step according to the preferred embodiment of the present invention; taken through the dotted-dashed line and viewed in the direction of the arrow shown in the top-down schematic view of FIG. 11B.

Design process 910 preferably translates an embodiment of the invention as shown in, for example, in FIG. 2 or in FIG. 11A, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2. Design structure 990 may then proceed to a stage 995 where, for example, design structure 990: proceeds to tape-out, is released to manufacturing, is released to a mask house, is sent to another design house, is sent back to the customer, etc.

Process for Making a MCSFET

A first preferred embodiment of a process according to the present invention is now shown and described with reference to FIGS. 6-11. Second and third preferred embodiments are shown in FIGS. 12-14 and 15-20, respectively.

In step one as shown in FIGS. 6A and 6B, provide a substrate 10 having formed thereon an elongated stack including a silicon portion 12 provided with a pad oxide 14 and a pad nitride 16 disposed on the pad oxide 14. The substrate 10 is, for example, bulk silicon, but may be a silicon-on-insulator or other suitable substrate. The pad oxide 14 preferably is formed, for example, by known thermal oxidation techniques and has a substantially uniform thickness or height in a range from approximately ($\mp 10\%$) 3 nm to approximately 10 nm, while the pad nitride 16 is conventionally formed by, for example, CVD deposition and has a substantially uniform thickness in a range of approximately of 60 nm to approximately 120 nm. In one preferred embodiment, the Si portion 12 of the stack has a height H of approximately a depth of a hole H for a shallow trench isolation (STI) region which is approximately 200 nm to approximately 300 nm and has a width W the same as the SRAM access transistor (which is typically NFET). The width is approximately 50 nm to approximately 100 nm.

The substrate 10 is etched conventionally to form STI holes H. STI techniques are well known by those skilled in the art. According to a preferred embodiment of the present invention, a first implant 20A is provided through a sidewall 12A and then a second implant 20B is provided through a sidewall 12B. Each implants is effected through know angled implant techniques. Suitable masks (not known) may be used to cover portions of the structure (FIG. 6B) which are not to be implanted. These implants contain suitable dopants such as N+ or P+ dopants. A final concentration of the first dopant from the first implant is different than a final concentration of the second dopant from the second implant. The first and second implants are a appropriately tilted and the species can be arsenic or boron. Each implant angle is dictated by avoiding a shadow effect from implant masks (not shown), and it ranges from approximately 15 deg to approximately 45 deg. The implant energy is controlled to achieve an implant depth of about 10 nm-about 35 nm. The dopant concentration sidewalls in 12A, 12B is about $10^{18}$ cm$^{-3}$ and $10^{19}$ cm$^{-3}$, respectively. The sidewall 12A faces in a direction that is approximately 180° different from a direction in which the sidewall 12B faces.

FIG. 6B is a top schematic view of multiple transistors (cells) showing the direction of the view of FIG. 6A.

In a step 2, the holes H are filled conventionally with, for example, a high density plasma (HDP) oxide 18, and then planarized (e.g., CMP) with the pad nitride. See FIG. 7A and FIG. 7B.

In a step 3, portions of the oxide 18 are removed (e.g., suitably etched) to form cavities C adjacent to the stack 12, 14, 16. A depth D is determined, for example, by etch time. Preferably, the depth D is approximately 20 nm to approximately 80 nm, and is substantially uniform. See FIG. 8A and FIG. 8B.

Figure 9B:
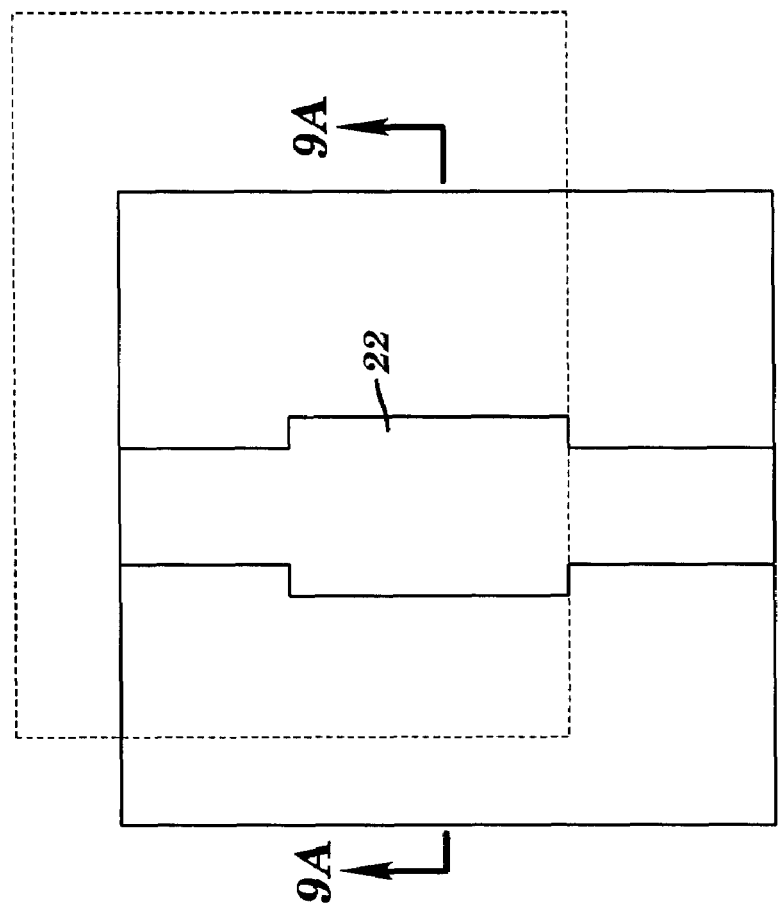
Figure 9A:
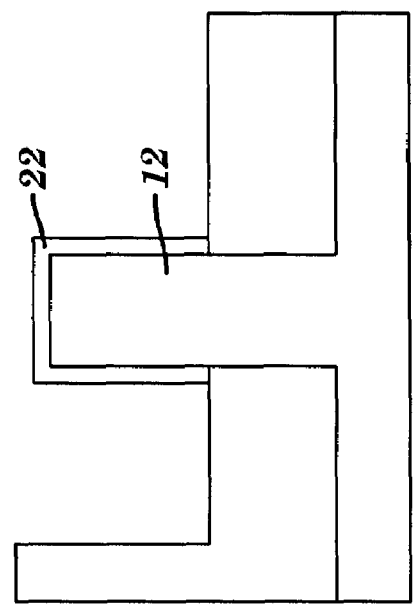
FIG. 9A is a side sectional schematic view of a fourth step according to the preferred embodiment of the present invention; taken through the dotted-dashed line and viewed in the direction of the arrow shown in the top-down schematic view of FIG. 9B.

In a step 4, the pad nitride 16 and the pad oxide 14 are conventionally removed by, for example, a suitable wet etch. Then, a gate dielectric 22 such as SiON or a high-k dielectric is formed on the stack 12 as shown in FIG. 9A and FIG. 9B. The formation of the gate dielectric is effected by conventional deposition techniques well known by those skilled in the art. Preferably the layer 22 has a substantially uniform thickness of approximately 3 nm. However, the thickness can be in a range of approximately 1.2 nm to approximately 3.5 nm.

Figure 10B:
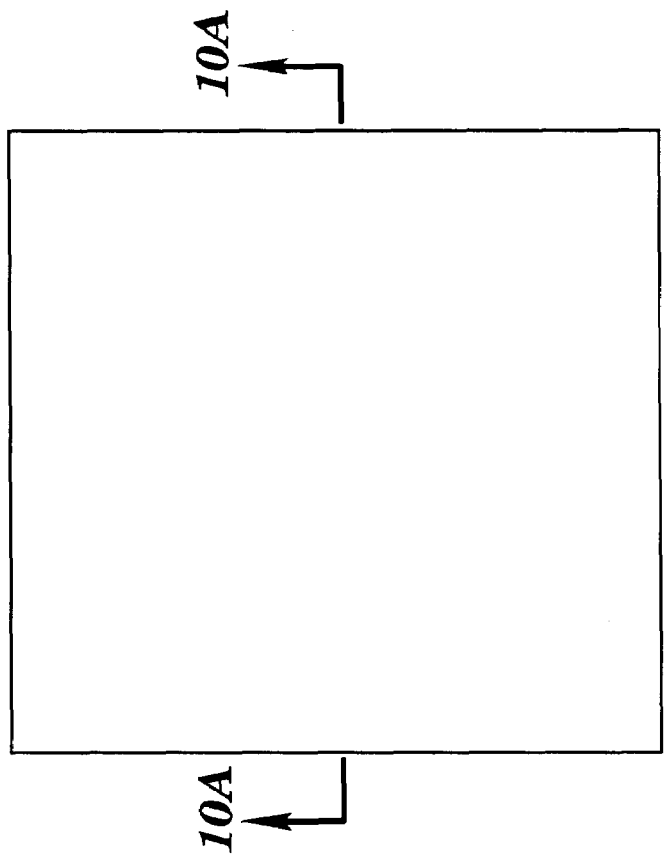
Figure 10A:
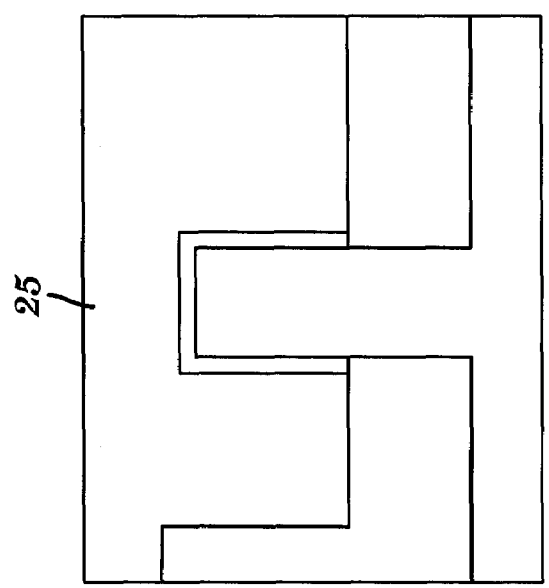
FIG. 10A is a side sectional schematic view of a fifth step according to the preferred embodiment of the present invention; taken through the dotted-dashed line and viewed in the direction of the arrow shown in the top-down schematic view of FIG. 10B.

In a step 5, a polysilicon layer 25 is deposited preferably onto the entire intermediate structure and then planarized (e.g., CMP) as shown schematically in FIG. 10A and FIG. 10B.

In step 6, source (s) and drain (d) regions S, D are conventionally formed and located as shown in FIG. 11B. The source and drain regions are formed, for example, by suitable N+ FOR NFET or P+ implants for PFET as would well understood by those skilled in the art: in view of the instant specification and figures. The intermediate structure is then patterned by conventional techniques to form a final MCSFET structure 30 shown in FIG. 11A and FIG. 11B. The source (S), drain (D) and gate (g) are shown in FIG. 11B. The present inventive process is readily compatible with existing CMOS manufacturing processes.

The resulting structures is then further processed conventionally (patterning, etc.)

Figure 13:
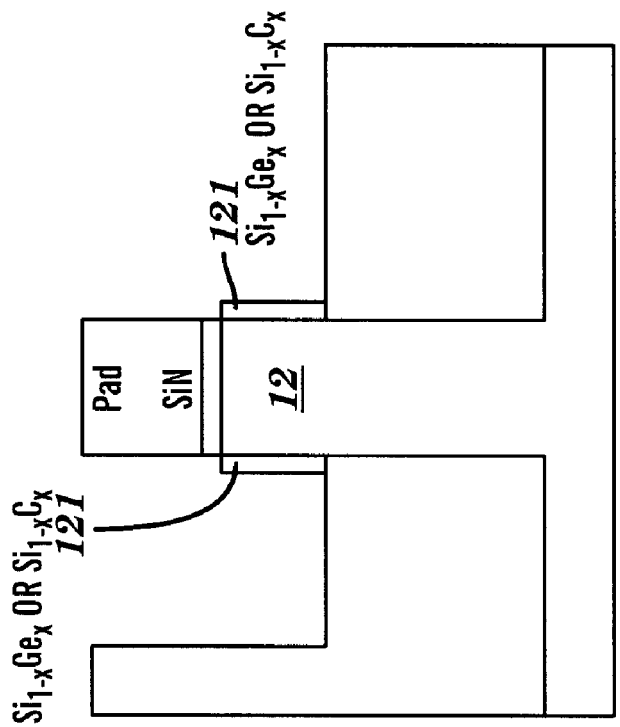
FIG. 13 is a side sectional schematic view of a fourth step according to a first alternative preferred embodiment of the present invention.
Figure 12:
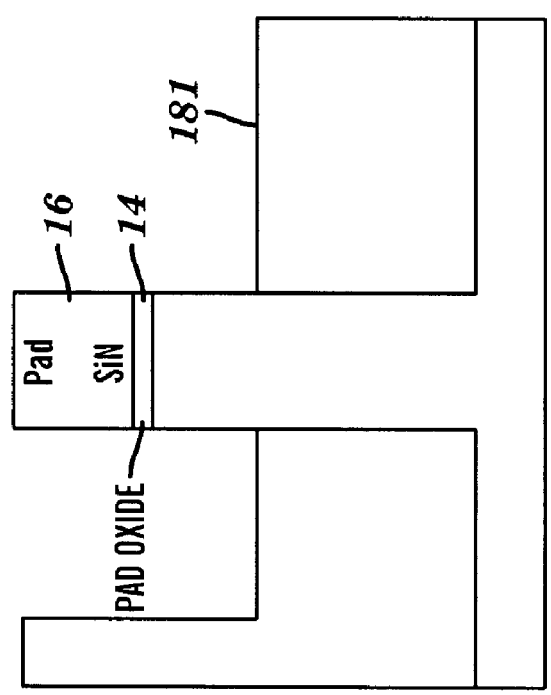
FIG. 12 is a side sectional schematic view of a third step equivalent to FIG. 8A, but showing a different depth D.
Figure 15:
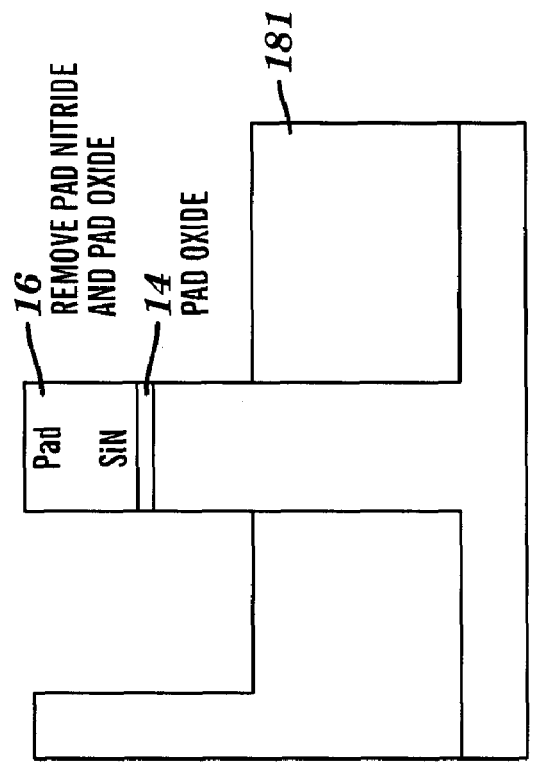
FIG. 15 is a side sectional schematic view of a third step equivalent to the step shown in FIG. 8A, but showing a different depth D.
Figure 14:
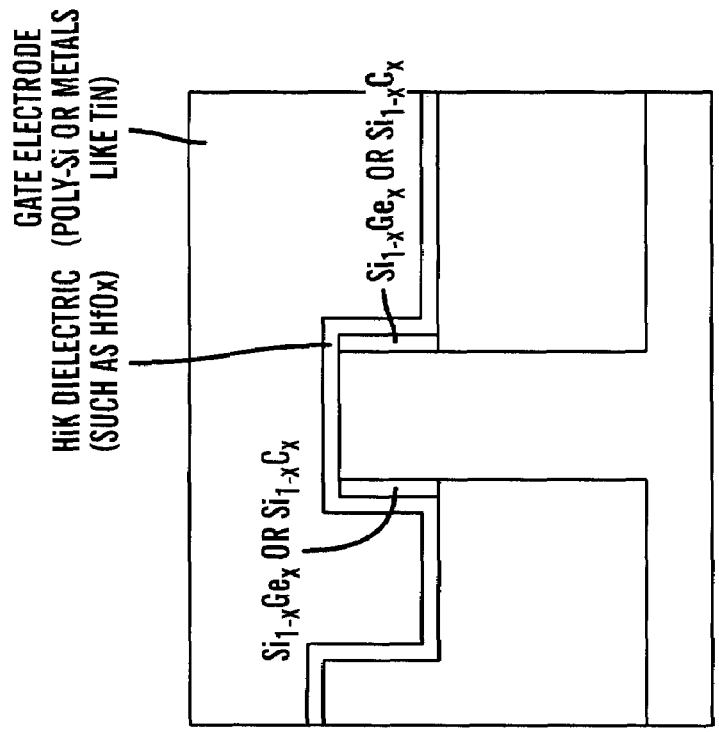
FIG. 14 is a side sectional schematic view of a structure resulting from fifth and sixth steps according to the first alternative preferred embodiment.
Figure 17:
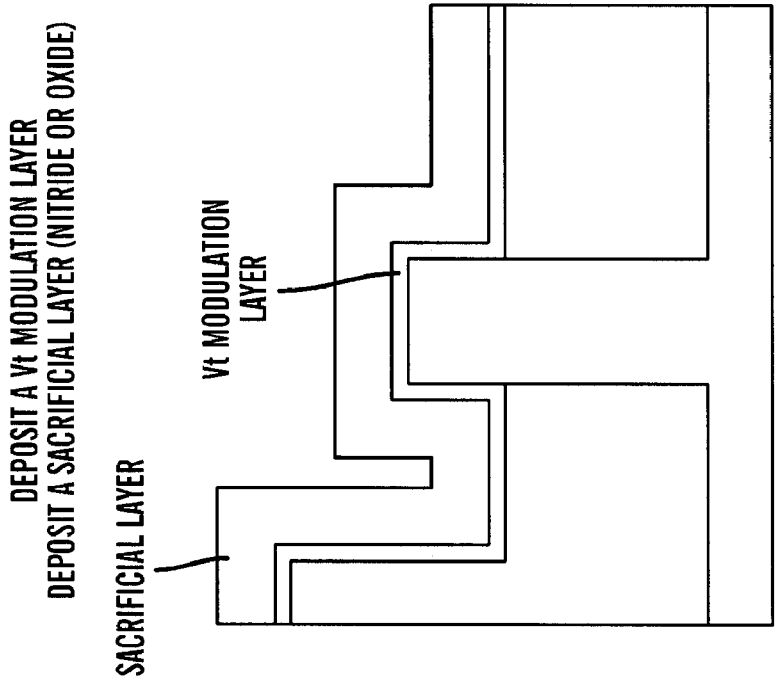
FIG. 17 is a side sectional schematic view of a fifth step according to the second alternative preferred embodiment.
Figure 16:
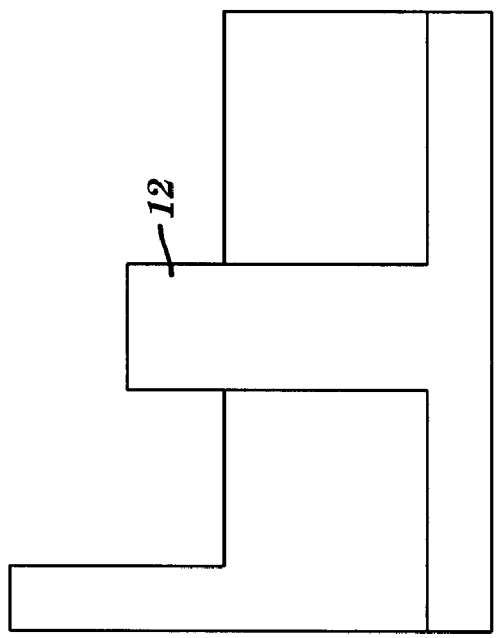
FIG. 16 is a side sectional schematic view of a fourth step according to a second alternative preferred embodiment of the present invention.
Figure 19:
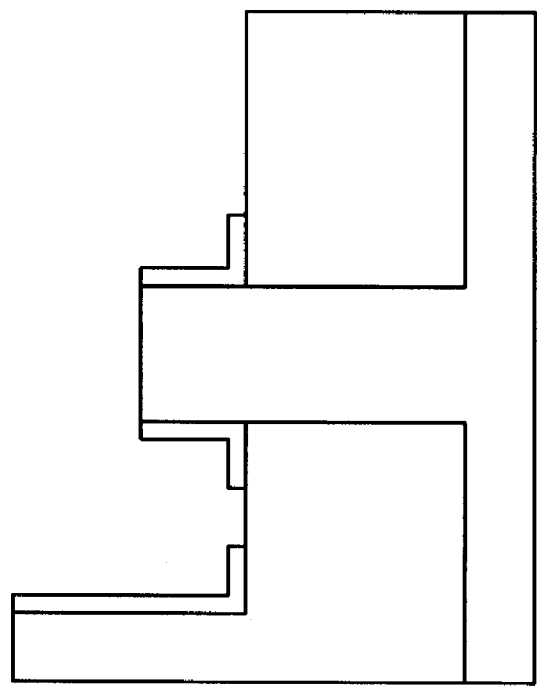
FIG. 19 is a side sectional schematic view of a seventh step according to the second alternative preferred embodiment.
Figure 18:
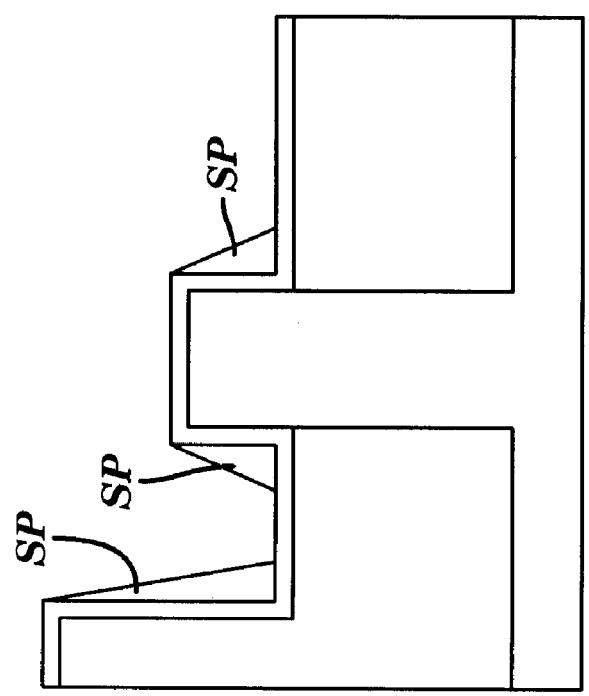
FIG. 18 is a side sectional schematic view of a sixth step according to the second alternative preferred embodiment.

FIGS. 12, 13 and 14 show a second preferred embodiment of the present invention.

Steps 1, 2 and 3 are the same as those for embodiment one, except for a lesser depth D of the material 181; See FIG. 12.

In a step four side layers 121 including Si are provided on to the sidewalls 12A, 12B as shown in FIG. 13. The layers 121 are $Si_{1-x}Ge_x$ or $Si_{1-x}C_x$ layers, and are selectively grown on the sidewalls 12A, 12B epitaxially by known techniques. Preferably, x for the Ge is in a range of approximately 10% to approximately 40%, while x for the C is in a range of approximately 0.5% to approximately 3%. Preferably, the layers have a substantially uniform thickness of approximately 2 nm.

In a step five, the layers 14, 16 are removed (e.g., etched) conventionally. In a step six, a high-k dielectric layer (e.g., $HfO_x$) having a substantially uniform thickness in a range of approximately 1.2 nm to approximately 3.5 nm is deposited conventionally over the intermediate structure. In a step seven, a gate electrode layer such as a polysilicon or a metal (e.g., TiN) is deposited onto high-k dielectric layer, to result in the structure shown in FIG. 14. Source and drain regions are formed conventionally after, for example, gate patterning. The structure is then processed conventionally.

FIGS. 15-20 show a third preferred embodiment of the present invention.

Steps one, two and three are the same as those for embodiment one, except for a lesser depth D of the material 181. See FIG. 15. In a step four remove the layers 14,16; See FIG. 16. In a step five, deposit a Vt modulation layer such as LaO having a substantially uniform thickening in a range of approximately one angstroms to approximately ten angstroms.

In a step six deposit a sacrificial layer such as a nitride or an oxide having a thickness in a range of approximately 25 nm to approximately 60 nm. See FIG. 17.

In a step seven, anisotopically etch the sacrificial layer to form spacer SP on the sides of the Vt modulation layer; See FIG. 18.

In a step eight, remove portions of the modulation layer not covered by the spacers SP, by either conventional dry or wet etch, and then remove the spacers SP by for example, etch. See FIG. 19.

Figure 20:
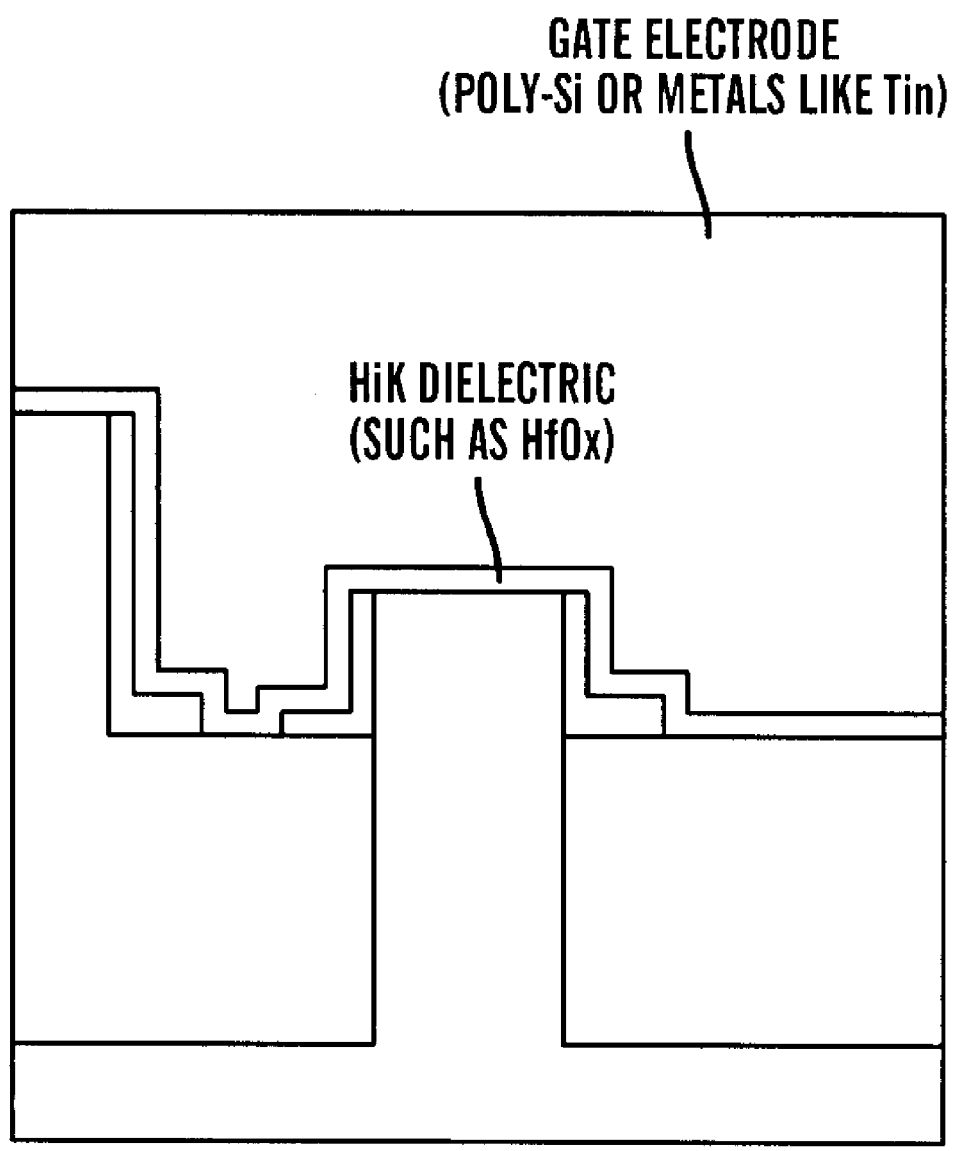
FIG. 20 is a side sectional schematic view of a eighth step according to the second alternative preferred embodiment.

In a step nine, deposit a high-k dielectric layer such as $HfO_x$ having a thickness of approximately 1.2 nm to approx 3 nm, and then deposit a gate electrode material such as polysilicon or TiN over the structure, all as shown in FIG. 20. Thereafter, proceed conventionally (patterning, etc.).

While the present invention has been particularly described in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method, comprising:
providing a substrate having formed thereon an elongated stack, the stack having a first sidewall facing in a first direction and a second sidewall facing in a second direction, the first direction differing from the second direction by approximately 180°;
providing a first implant having a first dose through the first sidewall, and
providing a second implant having a second dose through the second sidewall of the stack, the second dose creating a dopant concentration in the second sidewall which is greater than a dopant concentration created by the first dose in the first sidewall,
resulting in a single transistor with two distinctly different threshold voltages, or a MCSFET (Multiple Conduction State Field Effect Transistor).

2. The method as claimed in claim 1, wherein the dopant concentration created by the second dose in the second sidewall is at least approximately ten times greater than the dopant concentration created by the first dose in the first sidewall.

3. The method as claimed in claim 1, further comprising, providing side layers including Si onto the first and second sidewalls.

4. The method as claimed in claim 3, wherein the side layers are $Si_{1-x}Ge_x$, x being in a range of approximately 10% to approximately 40%.

5. The method as claimed in claim 3, wherein the side layers are $Si_{1-x}C_x$, x being in a range of approximately 0.5% to approximately 3%.

6. The method as claimed in claim 5, further comprising providing a pad oxide disposed on the stack and a pad nitride disposed on the pad oxide.

7. The method as claimed in claim 6, further comprising disposing an oxide adjacent to the first and the second sides.

8. The method as claimed in claim 7, further comprising planarizing the oxide and the pad nitride.

9. The method as claimed in claim 8, further comprising removing portions of the oxide adjacent to the first and the second sides to form cavities.

10. The method as claimed in claim 1, further comprising providing a Vt modulation layer onto the first and second sidewalls.

11. The method as claimed in claim 9, further comprising removing the pad nitride and the pad oxide.

12. The method as claimed in claim 11, further comprising forming a gate oxide onto the stack to form an intermediate structure.

13. The method as claimed in claim 12, further comprising disposing a semiconductor material onto the intermediate structure.

14. The method as claimed in claim 13, further comprising patterning the semiconductor material to form a gate conductor.

15. The method as claimed in claim 1, wherein the first implant creates a dopant concentration of approximately $1 \times 10^{17}$ cm-3 near a surface of the first sidewall.

16. The method as claimed in claim 1, wherein the second implant creates a dopant concentration of approximately $1 \times 10^{18}$ cm-3 at a location near a surface of the second sidewall.

17. The method as claimed in claim 13, wherein the semiconductor material is polysilicon.

* * * * *